United States Patent [19]

Iwanami et al.

[11] Patent Number: 4,906,856
[45] Date of Patent: Mar. 6, 1990

[54] SEMICONDUCTIVE PHOTODETECTION DEVICE HAVING COPLANAR CIRCUIT COMPONENTS

[75] Inventors: Eiichi Iwanami; Yukito Kawahara; Hiroshi Mukainakano, all of Tokyo, Japan

[73] Assignee: Seiko Instruments Inc., Japan

[21] Appl. No.: 177,829

[22] Filed: Mar. 23, 1988

Related U.S. Application Data

[62] Division of Ser. No. 799,413, Nov. 19, 1985.

[30] Foreign Application Priority Data

Nov. 20, 1984 [JP] Japan .................. 59-245601

[51] Int. Cl.$^4$ .......................... H01J 40/14
[52] U.S. Cl. ................... 358/213.11; 250/211 J; 357/30
[58] Field of Search .............. 250/211 J, 578; 357/30 P, 30 G, 30 H, 30 I, 30 R, 31, 32, 43, 45

[56] References Cited

U.S. PATENT DOCUMENTS

| | | |
|---|---|---|
| 3,465,293 | 9/1969 | Weckler . |
| 3,535,526 | 10/1970 | Henry et al. ............... 357/30 P |
| 3,617,823 | 11/1971 | Hofstern ............... 250/211 J |
| 3,660,667 | 5/1972 | Weimer ............... 250/578 |
| 3,822,362 | 7/1974 | Weckler et al. ............... 250/211 J |
| 4,145,721 | 3/1979 | Beaudouin et al. ............... 250/578 |
| 4,363,963 | 12/1982 | Ando ............... 250/211 J |
| 4,479,062 | 10/1984 | Kawasaki et al. ............... 250/578 |
| 4,511,804 | 4/1985 | Ozawa ............... 250/578 |
| 4,547,676 | 10/1985 | Suzuki et al. ............... 250/578 |

Primary Examiner—Edward P. Westin
Assistant Examiner—Khaled Shami
Attorney, Agent, or Firm—Bruce L. Adams; Van C. Wilks

[57] ABSTRACT

A photoelectric conversion array is comprised of a longitudinal semiconductor substrate formed with a plurality of doped regions electrically isolated from one another and equidistantly aligned in the longitudinal direction of the substrate. Each doped region is comprised of a first region containing therein base, collector and emitter regions arranged to constitute a bipolar phototransistor operative in response to irradiation of incident light onto the base region to induce a photoelectric current between the collector and emitter regions, and a second region disposed adjacent to and laterally of the first region and containing therein a drain region, a source region, a channel region between the drain and source regions and a gate region disposed on the channel region to constitute a MOS switching transistor electrically connected in series to the bipolar phototransistor and selectively operative in response to a control voltage applied to the gate region to enable the induced photoelectric current to flow through the channel region to thereby drive the corresponding bipolar phototransistor.

15 Claims, 2 Drawing Sheets

SEMICONDUCTIVE PHOTODETECTION DEVICE HAVING COPLANAR CIRCUIT COMPONENTS

BACKGROUND OF THE INVENTION

The present invention relates to semiconductor devices which conduct such operation as converting reflected light from a manuscript paper into an electric signal. The present invention especially relates to a semiconductor device which can conduct contact reading with a light-receiving portion which can correspond to the manuscript in its measurement by one to one.

FIG. 1 shows a typical diagram of a conventional contact reading type device.

Referring to FIG. 1, the contact reading device is composed of a photo cell array 22 consisting of amorphous silicon and the like, disposed on an insulative substrate 21 such as glass or alumina; an IC 23 provided with either a function to successively read the electric output of a photo cell, or a function to amplify the electric output even more; and a wiring group 24 which connects the photo cell array 22 and the IC 23.

In a case when a conventional contact reading semiconductor device reads an A4 size manuscript, if a resolution corresponding to 8 dots is necessary to read a 1 mm portion of the manuscript, approximately 2000 photo cells arranged at intervals of 125 μm will be necessary. Therefore, the number of wirings to pick up the signal from each photo cell becomes very large, and thus more than ten ICs for conducting signal processing will be necessary. And so, the process to connect the wiring and the IC is difficult, and is a factor which reduces the yield. Furthermore, as the wiring group 24 is formed so that IC 23 can be mounted on the insulative substrate 21, the area of the insulative substrate necessary for the wiring will be several ten times compared to the total area of photo cell array 22, and this will cause a reduction in the ability to manufacture at low cost. Also, as the wiring connecting the photo cell and the IC must be made of different lengths, their wiring capacity and wiring resistance differ, affecting the obtained signal, and the signal processing circuit to correct the effect will be complicated and thus high accuracy will be difficult.

SUMMARY OF THE INVENTION

It is an object of the present invention to mount the following parts along a straight line, with the same interval, on a conductive type single crystal substrate. Bipolar type photo transistors and drive circuits composed of switching MOS transistors and a shift register consisting of MOS transistors are integrated in the substrate.

DETAILED DESCRIPTION OF THE PREFERRED EMBODIMENTS

Figure 1:
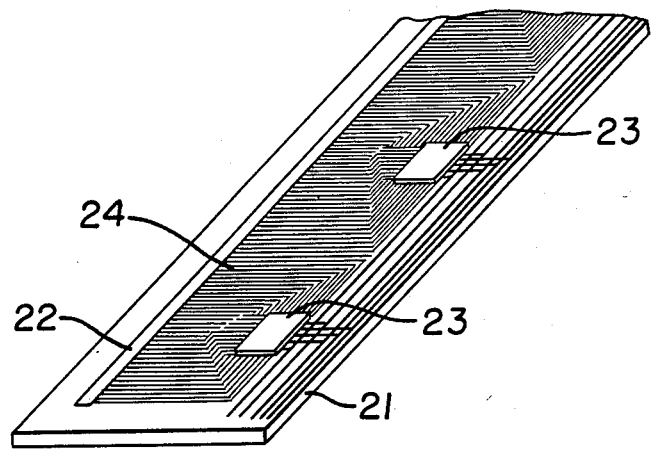
FIG. 1 is a perspective view of an embodiment of the semiconductor device.

The explanation of the present invention referring to the drawings is as follows.

Figure 2A:
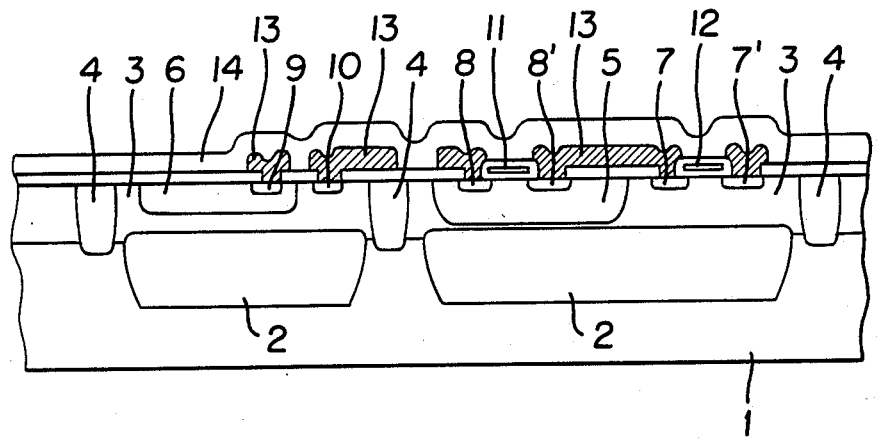
FIG. 2 is a sectional diagram of an embodiment of a semiconductor device of the present invention, drawn along A-A' line of FIG. 2b.
FIG. 2b is a plan view of an embodiment of the semiconductor device.

FIG. 2a is a sectional diagram of an embodiment of the semiconductive device of the present invention. Referring to FIG. 2a, numeral 1 is a P conductive type substrate. Numeral 2 is a selectively formed N type built-in layer of high impurity density, and, to keep the surface impurity density to $5 \times 10^{18}$ atoms/cm$^3$, for example, antimony is diffused within the N type built-in layer 2. Numeral 3 is an N type epitaxial layer havings its impurity density of $5 \times 10^{14}$ to $6 \times 10^{14}$ atoms/cm$^3$, and its thickness is approximately 5 to 15 μm to form a major surface portion of the semiconductor substrate. Numeral 4 is a P type separating or insulating layer formed to reach the P type substrate 1 from the surface of epitaxial layer 3, this separate layer being formed to surround and border each and every one of the later-mentioned photo transistors. Also, it is desirable to set the width of the P type separating layer between the adjacent photo transistors to be more than 40 μm when the resolution for reading the manuscript is 8 dots/mm, (8 dots are necessary to read a 1 mm long portion of the manuscript), and it is desirable to set the width to be more than 20 μm when 16 dots/mm resolution is required.

Numeral 5 is a P well of an N channel MOS transistor, its surface impurity density being $1 \times 10^{16}$ atoms/cm$^3$, and its depth being 3 to 8 μm. Numeral 6 is the base region of the photo transistor, its surface impurity being $1 \times 10^{16}$ to $1 \times 10^{18}$ atoms/cm$^3$ and its depth being 1.5 to 5 μm. This base region 6 can be formed simultaneously with the P well 5. Numerals 7 and 7' show drain and source regions of a P channel MOS transistor, their impurity density being high and formed as P conductive type. Numerals 8 and 8' show source and drain regions of an N channel MOS transistor being formed in the P well 5 with high impurity density of N conductive type. The surface impurity density of these source and drain regions of the MOS transistor are both more than $1 \times 10^{19}$ atoms/cm$^3$, and their depth is 0.1 to 3.0 μm. Numeral 9 is an emitter region of the photo transistor formed within the base region 6 to form therebetween a PN junction, its surface impurity density being $1 \times 10^{19}$ atoms/m$^3$ and its depth being 0.1 to 3.0 μm. Numeral 10 is a collector region of the photo transistor, formed on the surface of the epitaxial layer 3 with the same density profile. Numeral 11 and 12 are respectively gates of N channel and P channel MOS transistors, formed by phosphorous-doped or boron-doped polycrystalline silicon. Numeral 13 is metal wiring or an electrode region composed of aluminum and which has the main connecting function to electrically connect the above respective regions. Also as the metal wiring 9 usually reflects or absorbs light, it is not desirable to cover the base region 6 of the photo transistor. Therefore, the covered area of the base region should be less than a half of the whole area. Numeral 14 is a passivation film made of $SiO_2$, $Si_3N_4$ and the like, its thickness being about 1 to 2 μm. Furthermore, the scattering of the photo transistor output should be made small when outputting an 8- or 16-value signal as compared to outputting a 2-value signal. The arrangement of plurally formed photo transistors is as follows.

When the requirement for the resolution of reading is 8 dots/mm, the arrangement pitch in the lateral direction relative to the manuscript paper between the adjacent photo transistors is 125 μm, but its actual pitch can be permitted to 95 μm at its maximum when considering the mutual interference between the photo transistors and cutting accuracy. Its lateral dimension will be 10 μm at its minimum, because of lithography technology and the limitation of the output of the photo transistors. The dimension in the longitudinal direction with respect to the longitudinal substrate 1 will be 125 μm at its maximum from the limitation of the pitches, and its minimum dimension is 50 μm because of the limitation of the photo transistors. Meanwhile, when the requirement for the resolution of reading is 16 dots/mm, the arrangement pitch in the lateral direction between the adjacent photo transistors will be 62.5 μm. But actually, as in the case of 8 dots/mm, the lateral dimension should be 10 m to 32.5 μm, and the longitudinal dimension should be 25 to 62.5 μm. Also the valid base region of the photo transistor that receives and senses the incident light will be the region where the incident light is not shut out by the metal layer.

The above stated photo transistor is formed by utilizing such semiconductive circuit manufacturing methods as ion implantation, thermal diffusion, photo-lithography, vapour phase epitaxial growth, chemical vapour deposition, vacuum evaporation, and sputtering.

In the above explanation of the basic fundamental structure, instead of the photo transistor, MOS transistor, the reverse conductive type transistors can be utilized. Also, the drive circuit composed of N channel and P channel MOS transistors can be replaced simply by an N channel transistor. And, the gate of the MOS transistor can be formed by metal such as aluminum. On the surface of the single crystal below the gate, phosphorous or phorone may be ion-implanted to control the threshold voltage of the channel region.

Figure 2B:
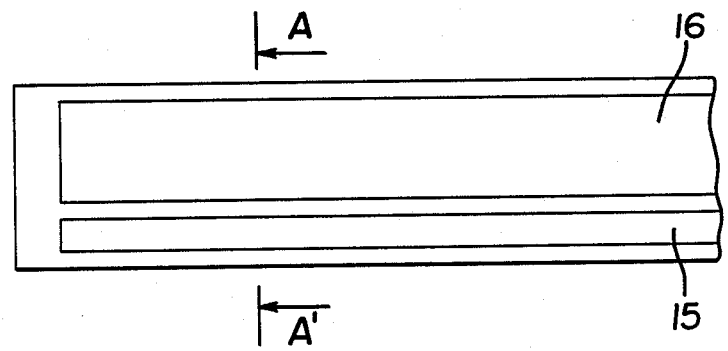

FIG. 2b shows a part of the plan view of an embodiment of the semiconductive device of the present invention. This embodiment is basically composed of: a longitudinal substrate; a plurality of photo transistors each consisting of the base region 6, emitter region 9, and collector region 10 and being arranged to form a photo transistor row 15 arranged in a straight line in the longitudinal direction of the substrate; and drive circuits corresponding in number to the photo transistors to form a drive circuit row 16 arranged in a straight line. FIG. 2a is the sectional diagram showing the device along line A-A' of FIG. 2b. As understood from these drawings, photo transistors and drive circuits in the form of MOS transistors are in pairs, and their width in the lateral direction is approximately the same.

Figure 3:
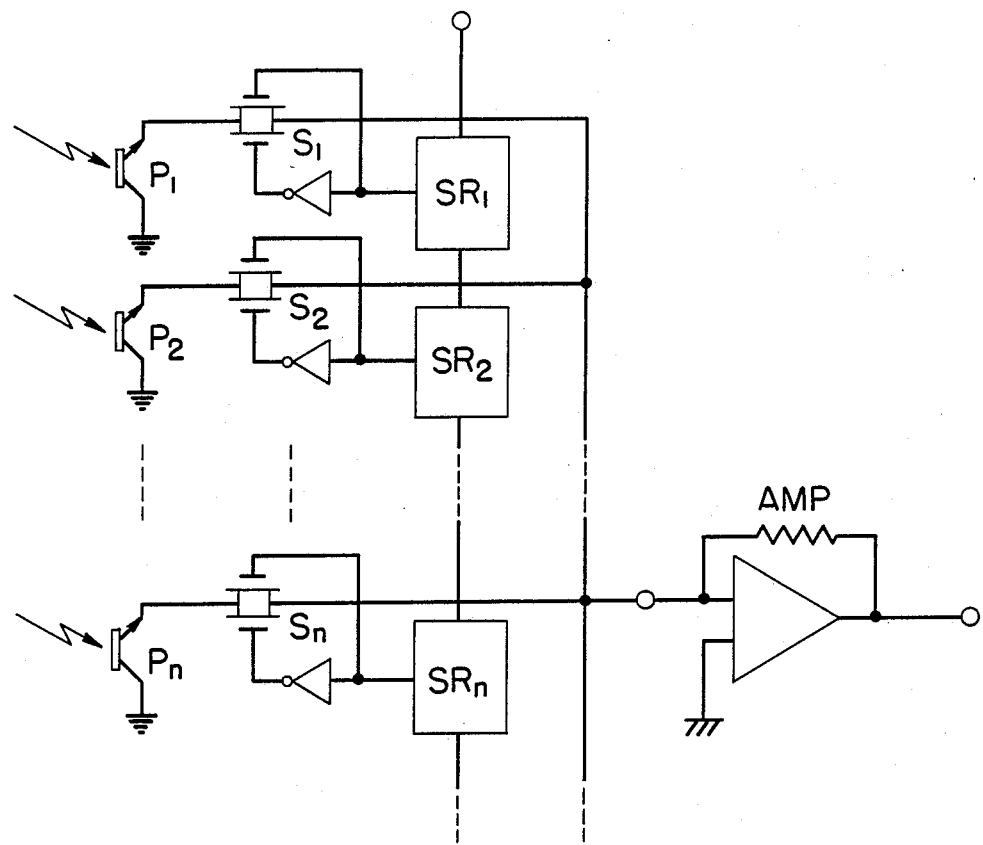
FIG. 3 is an equivalent circuit diagram of the semiconductor.
Figure 4:
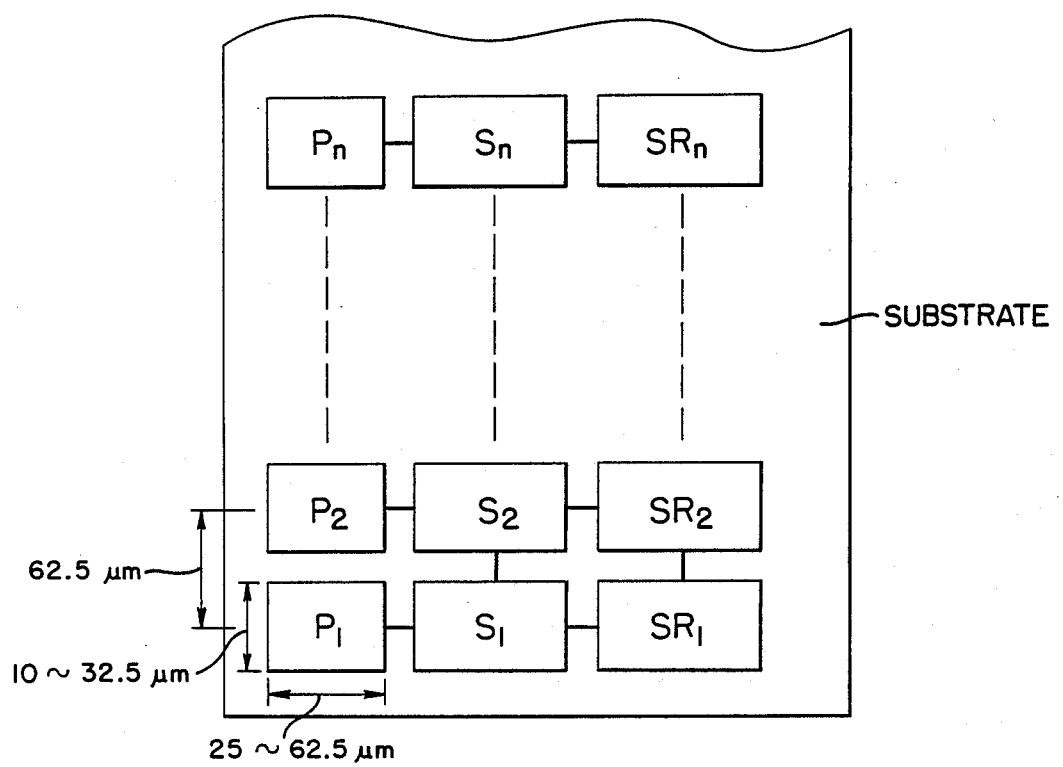
FIG. 4 is a schematic view of the semiconductor device.

FIG. 3 is an example of an equivalent circuit diagram of the semiconductive device of the present invention, and FIG. 4 is a schematic representation therof composed of the following parts: collectors connected to a high certain potential ground and bases in a floating state to form a plurality of photo transistors $P_1, P_2, \ldots P_n$, in which emitters are connected to the drive circuit side of the MOS transistors; signal transmitting elements $S_1, S_2, \ldots S_n$ consisting of analogue switches of the MOS transistors; shift registers $SR_1, SR_2, \ldots SR_n$ to successively or sequentially turn on or enable the switches $S_1, S_2, \ldots S_n$; and an amplifier AMP for effecting current-voltage conversion at terminals to which the output of the plurality of switches $S_1, S_2, \ldots S_n$ are connected. The construction of the semiconductive device of the present invention includes at least a plurality of photo transistors $P_1, P_2, \ldots P_n$, signal transmitting elements or switches $S_1, S_2, \ldots S_n$, multi-stage shift register $SR_1, SR_2, \ldots SR_n$, and an amplifier AMP may be or may not be included. When the amplifier AMP is not utilized, the OFF SET is especially small, and a bipolar transistor with high gain and very efficient frequency characteristic can be utilized.

The explanation of the operation of the semiconductive device of the present invention referring to FIG. 3 is as follows. The reflected light on the manuscript is irradiated onto the photo transistors $P_1, P_2, \ldots P_n$. When the part of the manuscript detected by the photo transistor $P_1$ is white, a very strong light incidence will occur. Therefore holes or electrons are generated in the photo transistor $P_1$. By the potential generated at the PN junction, the holes and electrons are accumulated to the base and the epitaxial layer, respectively. The PN junction is formed by the base region and the active collector region in the epitaxial layer. This operation is conducted during the time equal to the time necessary to read one line of the manuscript.

Next, when the channels of switch $S_1$ are turned on by the output or control voltage of the shift register stage $SR_1$ applied to the gates of the switch $S_1$, the photo transistor $P_1$ becomes in the bias condition from the floating condition, and thus the emitter of the photo transistor is connected to the input terminal of the amplifier AMP through the channels of the switch $S_1$. Therefore, by the accumulation of the holes, the base of the photo transistor becomes the same condition as it is biased forward relative to the emitter, and, by the potential applied to the collector, a relatively large photoelectric current passes from the collector to the emitter through the switch and to the input terminal of the amplifier AMP and a large voltage is produced at the output terminal of the amplifier AMP.

On the other hand, if the manuscript portion corresponding to the photo transistor $P_1$ is black, the irradiation light to this photo transistor will be weak, and almost no holes or electrons are accumulated on the base and the epitaxial layer of the photo transistor $P_1$. Therefore, even when the switch $S_1$ is turned on, almost no electric current passes, and the voltage produced at the output terminal of the amplifier AMP will be small. If the color of the manuscript is grey, a corresponding current of the photo transistor passes, and an output voltage having a medium amount between the output at white color and the output at black color is produced at the output terminal of the amplifier AMP. The above operation is successively repeated for each of the photo transistors $P_1, P_2, \ldots P_n$ arranged in the direction relative to the manuscript paper.

The output current obtained at the photo transistors $P_1, P_2, \ldots P_n$ is approximately two figures larger than the electric current generated at photo cells, such as amorphous silicon photo diodes or PN photo diodes formed in an identical area, and so by utilizing the photo transistors $P_1, P_2, \ldots P_n$, the effect of noise generated at the switches $S_1, S_2, \ldots S_n$ will e relatively small. Also, as the large wiring capacity due to the connecting wiring from a plurality of photo transistors to the amplifier AMP can decrease the number of wirings, the sensitivity of the whole semiconductive device will not be much reduced.

The present invention utilizes the bipolar photo transistor as its photo cell, and so the sensitivity is one figure larger than the conventional diode type photo cell. Therefore, the area of the photo cell portion may be small, and as a result, there will be allowance for the cutting of the chip. Further, an oblong-shaped or longitudinal reading device can be easily obtained at low price, by directly connecting a plurality of chips in the lateral direction relative to the manuscript paper. Also, by integrating the photo transistors and drive circuits into a single crystal substrate in a monolithic style, the wiring which connects the photo cell and the drive circuit can be made short and uniform. Therefore, the sensitivity improves and the scattering of the output reduces. With the conventional IC, there are problems wherein the dimension has to be 16 dots/mm because individual drive circuits are connected with wire bonds and such, or wherein the connection is extremely difficult because of colorization, but these problems are simultaneously solved with the present invention.

As explained so far, with the present invention, it is possible to obtain low price and small size contact reading devices for reading manuscripts, and so multi-function ability and high efficiency can be obtained for a facsimile, multi-purpose scanner, word processor and the like. Therefore, the present invention can contribute to the developement of electronic instruments.

Furthermore, with the present semiconductive device, as the photo transistors and drive circuits are formed on the same single crystal substrate, the wiring to connect the two parts can be easily done simultaneously with the wiring of the drive circuit, the length will be shortened, and it is possible to use wiring having the same shape and length. Also, as the sensitivity of the photo transistor is one figure larger than that of the conventional photo cell, not only the construction of the amplifier is made simple but also the circuit operation is carried out at high speed.

We claim:

1. A photoelectric conversion array, comprising: an elongate semiconductor substrate having a major surface portion; means on defining on the substrate major surface portion a plurality of doped regions electrically isolated from one another and equi-distantly aligned in the longitudinal direction of the substrate, each doped region being comprised of a first region containing therein base, collector and emitter regions arranged to constitute a bipolar phototransistor operative in response to irradiation of incident light onto the base region to induce a photoelectric current between the collector and emitter regions, and a second region coplanar with the first region and containing therein a drain region, a source region, a channel region between the drain and source regions and a gate region disposed on the channel region to constitute a MOS transistor electrically connected in series to the bipolar phototransistor and operative in response to a control voltage applied to the gate region to enable to induced photoelectric current to flow through the channel region to thereby drive the bipolar phototransistor; and drive means formed in the substrate major surface portion for sequentially applying a control voltage to the respective gate regions of the MOS transistors.

2. A photoelectric conversion array according to claim 1; wherein the longitudinal semiconductor substrate comprises a semiconductor base, and an epitaxial layer disposed on the semiconductor base and defining the major surface portion of the semiconductor substrate, the epitaxial layer having an insulating region bordering the plurality of doped regions to electrically insulate the doped regions from each other.

3. A photoelectric conversion array according to claim 1; wherein the first region contains a base region, and an emitter region disposed within the base region to form a PN junction therebetween effective to induce a photoelectric current.

4. A photoelectric conversion array according to claim 1; wherein the second region contains two sets of drain, source, channel and gate regions of different conductive types to constitute a pair of N-channel and P-channel MOS transistors, one of the pair of MOS transistors of each of the second regions jointly comprising the drive means.

5. A photoelectric conversion array according to claim 1; including a first electrode region electrically connecting the collector region to ground potential, and a second electrode region electrically connecting the emitter region to the channel region.

6. A photoelectric coversion array according to claim 1; wherein the drive means comprises shift register means for sequentially assigning a control voltage to the respective MOS transistors.

7. A photoelectric conversion array according to claim 6; wherein the shift register means comprises a plurality of shift register stages corresponding in number to the number of MOS transistors and being comprised of other MOS transistors.

8. A photoelectric conversion array, comprising:
a semiconductor substrate having a major surface portion;
a plurality of bipolar transistors formed in a row on the substrate major surface portion and being equi-distantly spaced apart in the row direction, each of the bipolar transistors having a collector region, an emitter region and a base region and being operative in response to irradiation of incident light onto the base region to induce a photoelectric current signal between the collector and emitter regions; and
read-out means formed on the substrate major surface portion for sequentially reading out the photoelectric current signals produced by the bipolar transistors, the read-out means comprising a plurality of signal transmitting elements formed in a row on the substrate major surface portion in parallel with and laterally spaced from the row of bipolar transistors, each signal transmitting element being electrically connected to a corresponding one of the bipolar transistors and operative when enabled to transmit therethrough the photoelectric current signal, and shift register means for sequentially enabling the signal transmitting elements to thereby read out the photoelectric current signals.

9. A photoelectric conversion array according to claim 8; wherein the signal transmitting elements comprise MOS transistors, each of the MOS transistors having a drain region, a source region, a channel region between the source and drain regions and a gate electrode disposed on the channel region, and each of the MOS transistors being electrically connected in series to a corresponding one of the plurality of bipolar transistors and operative in response to a control voltage applied to the gate electrode thereof to enable the photoelectric current signal to flow through the channel region thereof.

10. A photoelectric conversion array according to claim 8; wherein each bipolar transistor and its corresponding signal transmitting element are formed on the same plane with respect to the depth direction of the substrate major surface portion.

11. A photoelectric conversion array according to claim 10; wherein each of the signal transmitting elements comprises a MOS transistor electrically connected to the emitter region of its corresponding bipolar transistor.

12. A photoelectric conversion array according to claim 11 wherein the shift register means has a plurality of stages, each stage being connected to the gate electrode of a corresponding MOS transistor.

13. A photoelectric conversion array according to claim 12; wherein the pitch of the bipolar transistors in the row direction is about 62.5 μm, each bipolar transistor having dimensions between about 10 μm and about 32.5 μm in the row direction and between about 25 μm and about 62.5 μm in a direction transverse to the row direction.

14. A photoelectric conversion array, comprising:
a semiconductor substrate having a major surface portion;
a plurality of bipolar transistors for producing video signals, the bipolar transistors being formed in a row on the substrate major surface portion and being equi-distantly spaced apart in the row direction and
read-out means disposed in parallel with the row of bipolar transistors and formed on the substrate major surface portion on the same plane with the bipolar transistors for reading out the video signals from the bipolar transistors, said read-out means comprising a plurality of signal transmitting elements each electrically connected to a respective one of the bipolar transistors and operative when activated to transmit therethrough the video signal, and shift register means for sequentially activating the signal transmitting elements to thereby sequentially read out the video signals from the bipolar transistors.

15. A photoelectric conversion array according to claim 14; wherein the signal transmitting elements and the shift register means comprise MOS transistors.

* * * * *